United States Patent [19]
Fuhrmann et al.

[11] Patent Number: 6,051,780
[45] Date of Patent: Apr. 18, 2000

[54] SCREENING DEVICE AGAINST ELECTROMAGNETIC RADIATION

[75] Inventors: Thomas Fuhrmann, Dulmen/Buldern; Jurgen Matthies, Witten, both of Germany

[73] Assignee: Nokia Mobiles Phones Ltd., Espoo, Finland

[21] Appl. No.: 08/892,189

[22] Filed: Jul. 14, 1997

[30] Foreign Application Priority Data

Jul. 19, 1996 [DE] Germany .......................... 296 12 557

[51] Int. Cl.[7] ..................................................... H05K 9/00
[52] U.S. Cl. ................................... 174/35 GC; 174/35 R
[58] Field of Search ........................... 174/35 R, 35 MS, 174/35 GC; 361/800, 816, 818

[56] References Cited

U.S. PATENT DOCUMENTS

| | | | |
|---|---|---|---|
| 4,912,604 | 3/1990 | Vaisanen | 361/424 |
| 4,945,633 | 8/1990 | Hakanen et al. | 29/825 |
| 5,006,667 | 4/1991 | Lonka | 174/35 R |
| 5,053,924 | 10/1991 | Kurgen | 361/816 |
| 5,271,056 | 12/1993 | Pesola et al. | 379/58 |
| 5,365,410 | 11/1994 | Lonka | 361/816 |
| 5,400,949 | 3/1995 | Hirvonen et al. | 328/180.22 |
| 5,442,521 | 8/1995 | Hirvonen et al. | 361/800 |
| 5,596,170 | 1/1997 | Barina et al. | 174/35 R |
| 5,603,103 | 2/1997 | Halttunen et al. | 455/90 |
| 5,770,822 | 6/1998 | Abolitz et al. | 174/35 GC |
| 5,777,854 | 7/1998 | Welch et al. | 361/800 |

*Primary Examiner*—Kristine Kincaid
*Assistant Examiner*—Hung V Ngo
*Attorney, Agent, or Firm*—Perman & Green, LLP

[57] ABSTRACT

Screening device against electromagnetic radiation, having a thin structural unit (2) which extends in a plane and is provided with walls (3) running essentially perpendicular to the plane, whereas the walls (3) themselves, at least in partial regions, are elastically deformable in the direction of the structural unit (2).

8 Claims, 5 Drawing Sheets

SCREENING DEVICE AGAINST ELECTROMAGNETIC RADIATION

The invention relates to a screening device against electromagnetic radiation according to the preamble of claim 1.

A screening device of this type is already generally known. It has a thin structural unit which extends in a plane and is provided with walls running essentially perpendicular to the plane. The structural unit and walls are electrically conductive, at least in partial regions, and serve to screen radio-frequency circuits and digital-technology circuits which are situated on a printed circuit board, for example. For this purpose, the screening device is placed onto the printed circuit board in such a way that the free ends of the walls come to lie on conductor tracks which are at screening or earth potential.

In order to ensure good electrical contact between the free and electrically conductive ends of the walls, on the one hand, and the conductor tracks on the printed circuit board, on the other hand, an electrically conductive paste, for example conductive silicone, has previously been applied to the conductor tracks in order then to press the free ends of the walls of the screening device into the conductive paste that has been applied. However, the application of the conductive paste to the conductor tracks of the printed circuit board constitutes a relatively expensive operation, which has an adverse effect on the overall production costs of a device in which circuits are screened in this way.

Replacing the abovementioned conductive paste by a metallic frame which is placed onto the conductor tracks and comes to lie between the latter and the free ends of the said walls has already been conceived of. This conductive frame has frame sections which are bent out of the plane of the frame and ensure tolerance compensation and hence reliable contact between conductor track and screening device. However, this also necessitates the separate production of the conductive frame, thereby likewise causing additional costs.

It is furthermore known, from DE 41 90 697 C1, to insert clamping elements in ends of walls of a screening device, which clamping elements are equipped with resilient tongues. These resilient tongues are then pressed elastically against a conductor track situated on a printed circuit board when the screening device is placed onto the printed circuit board. However, in addition to the production of the clamping elements having tongues, this also necessitates separate processing of the walls of the screening device, which makes the production and mounting process of such a screening device particularly expensive.

The invention is based on the object of developing a screening device of the type mentioned in the introduction in such a way that, on the one hand, it enables reliable electrical contact between the free ends of the walls and the conductor tracks and, on the other hand, it can be produced and mounted simply and cost-effectively.

The object is achieved in the manner specified in the characterizing part of claim 1. Advantageous refinements of the invention can be found in the subclaims.

A screening device according to the invention against electromagnetic radiation, having a thin structural unit which extends in a plane and is provided with walls running essentially perpendicular to the plane, is distinguished by the fact that the walls themselves, at least in partial regions, are elastically deformable in the direction of the structural unit.

By virtue of the fact that when the screening device is fitted into an electrical device, the walls themselves or parts thereof can be elastically displaced relative to the structural unit and in the direction of the structural unit, reliable contact of the end and electrically conductive wall regions e.g. with a conductor track present on a printed circuit board is ensured, without necessitating for this purpose additional means such as conductive adhesives, elastic frames or clamping elements provided with elastic tongues. Tolerance compensation between conductor track and end wall regions is therefore effected by the walls themselves, it naturally having to be ensured that the end regions of the walls, prior to fitting into the device, must project far enough from the structural unit that they are pressed against the conductor track after fitting. In other words, the height of the end regions of the walls above the structural unit prior to fitting must be slightly greater than the actual height of the space accommodating the walls in the device after the assembly thereof.

The said device may be, for example, a portable radio telephone (mobile phone).

According to a very advantageous refinement of the invention, the structural unit and walls are composed of a deep-drawn sheet. This deep-drawn sheet may, for example, be composed of plastic and have an electrically conductive layer at least on that side on which the walls are also situated. The said electrically conductive layer may be, for example, a metal vapour deposition layer.

A screening device of this type can be produced cost-effectively and with relatively low weight, with the result that it is particularly suitable for use in a portable radio telephone.

Although there is the risk that deep-drawn sheets easily bulge, this would not have a disadvantageous effect on the reliability of electrical contact between a conductor track and the end wall regions of the screening device, since the walls of the latter are, according to the invention, elastically deformed in the direction of the structural unit, as a result of which deviations induced by bulging can be compensated for.

According to an advantageous development of the invention, the walls have elastically deformable sections in the lateral region.

In the case of a deep-drawn sheet, each wall is formed by two virtually parallel side regions which lie at a distance from one another and in which the elastically deformable sections may be situated. They may also be situated in the base region of the walls, with the result that, if appropriate, parts of the structural unit can then also be included, in order to arrive at even greater elasticity or displacement capability perpendicular to the structural unit.

According to another advantageous development of the invention, the walls are designed to be elastically deformable at their free ends. For this purpose, the free ends may be elastically deformable over their entire length, for which purpose corresponding shaping is carried out. Thus, the free ends can, for example, run only convexly over their entire length and be pressed in by the printed circuit board. Alternatively, it is possible additionally to design the edge regions of the ends to be concave as well, in order to obtain a type of articulated joint between the end regions of a wall and its side regions.

In a further refinement of the invention, the free ends are elastically deformable in sections. The distance between the respective sections along a wall in this case depends on the requirements of the desired screen, in other words depends in practice on the frequency of the electromagnetic radiation to be screened.

In this case, the free ends may be designed to be convex in the said sections, in order to obtain so-called elastic domes against which the printed circuit board is pressed. In order to increase the elasticity of the domes, the latter may, for example, be surrounded by concave borders.

As an alternative, however, the free ends may also be cut open and bent elastically outwards in the said sections. Resilient tongues are then obtained which are integrally connected to the walls.

Moreover, particularly in the case of a sheet used to form the screening device, the structural unit and the walls are integrally connected to one another, the elastically deformable sections being parts of the walls and, consequently, likewise being integrally connected thereto.

Exemplary embodiments of the invention are described in more detail below with reference to the drawing, in which:

FIG. 1 shows a first embodiment of a screening device according to the invention, a detail of which is shown enlarged in FIG. 2.

Figure 1:
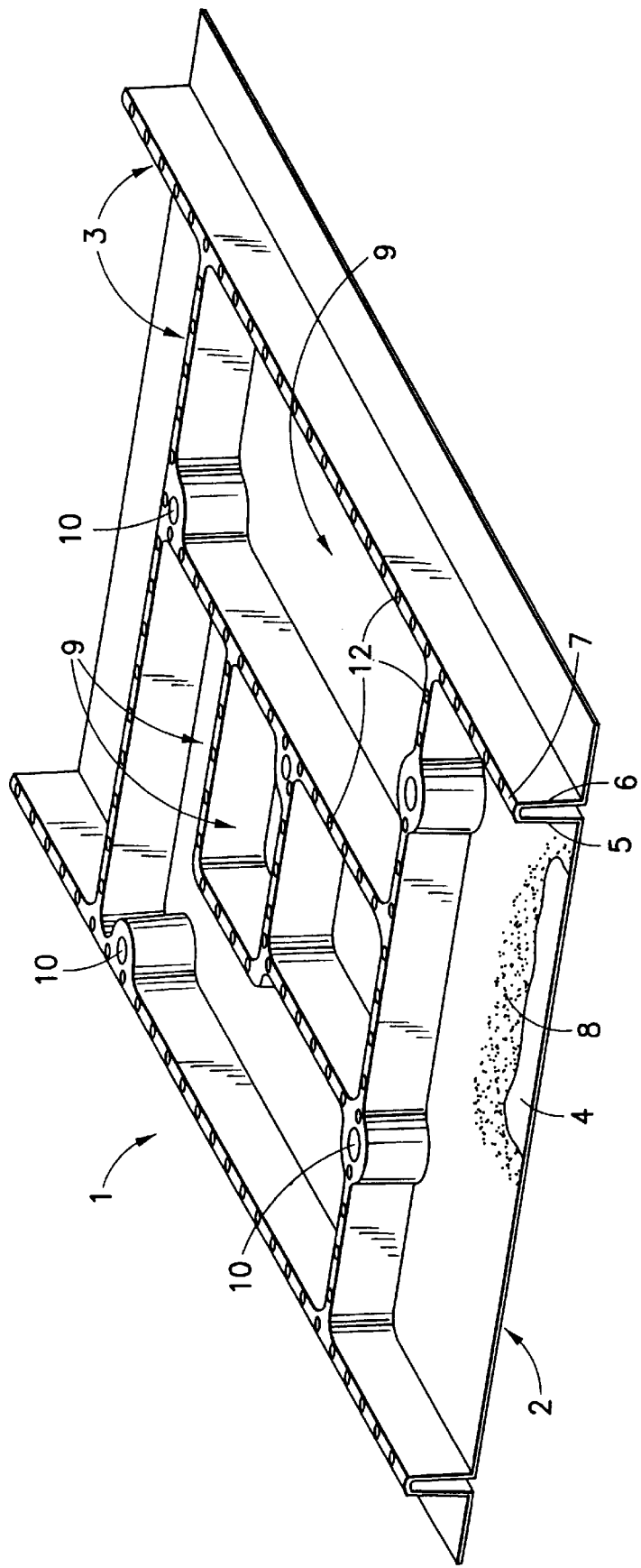
FIG. 1 shows a perspective view of the screening device according to the invention from a side onto which a printed circuit board is placed.
Figure 2:
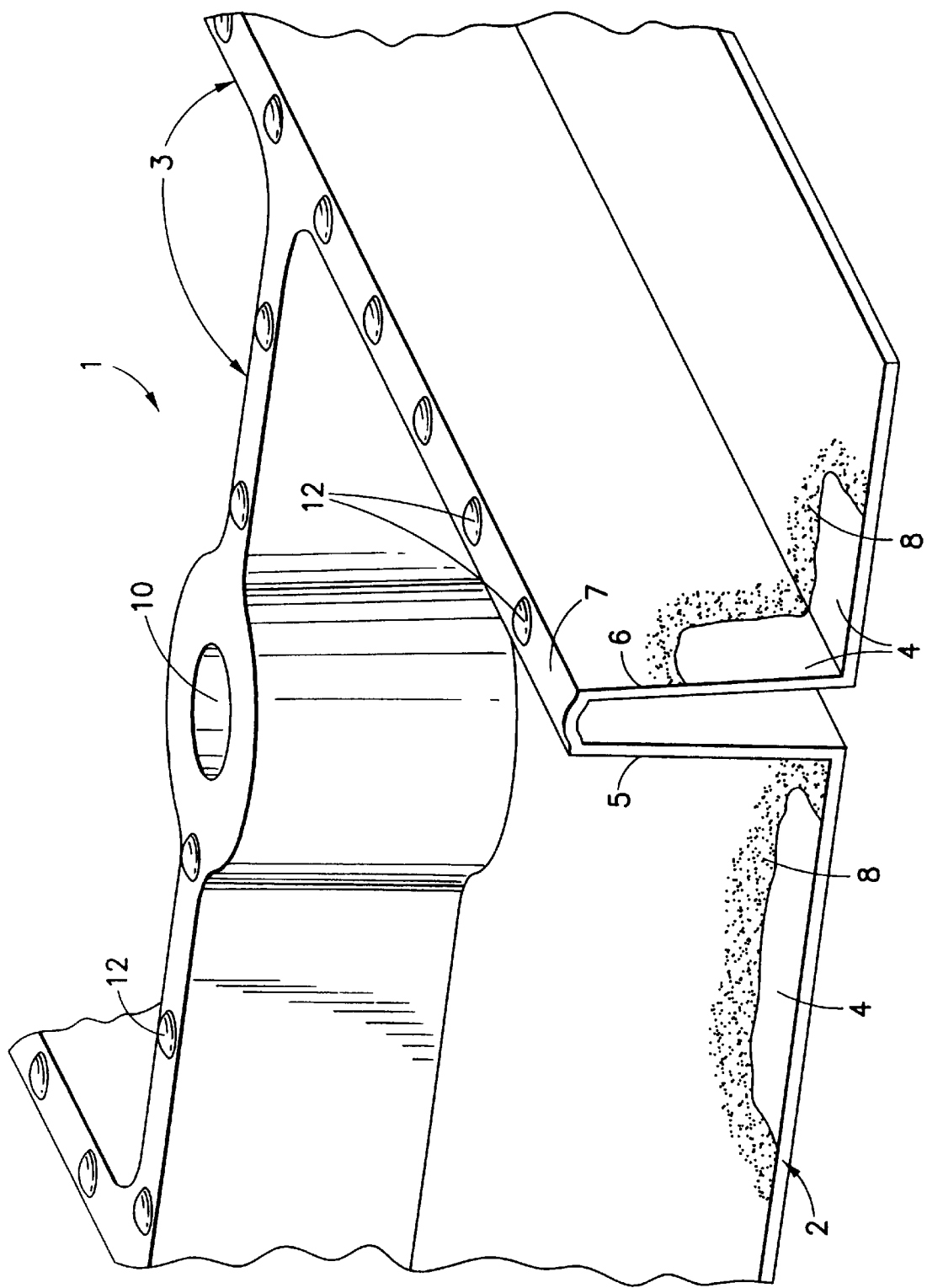
FIG. 2 shows an enlarged detail of the screening device according to FIG. 1.

The screening device is provided with the reference symbol 1 and comprises a planar or plate-shaped structural unit 2, which, on one of its sides, has walls 3 which are integrally connected to it. The structural unit and walls are formed by a deep-drawn sheet 4, with the result that the walls 3 have two side regions 5 and 6 which run virtually parallel and at a distance from one another, are connected to one another via an end wall region 7 and are approximately perpendicular to the structural unit 2. The sheet 4 is composed of electrically insulating material or plastic. On the side of the walls 3, the screening device 1 is provided with an electrically conductive layer 8, which completely covers the sheet 4 and is also situated on the side regions 5 and 6 as well as on the end wall regions 7 of all the walls 3. This electrically conductive layer 8 may be formed by the vapour deposition of metal.

Individual chambers 9 for accommodating electrical components are obtained by the walls 3, which components are situated on an electrical printed circuit board (not illustrated) which is placed, with conductor tracks printed on it, onto the end wall regions 7 of the screening device 1. The wall regions 3 can be extended in order to form through-passage regions 10, through which screws, for example, can be passed in order to clamp the screening device 1 in between the said printed circuit board and a mount situated on the other side of the screening device 1. This mount can be seen in FIGS. 3 and 4 and is provided with the reference symbol 11.

Instead of the two-part design of the screening device 1 made of electrically non-conductive or plastic sheet 4 and electrically conductive coating 8, the screening device 1 can also be formed just from one electrically conductive sheet, by deep-drawing, for example from a metal sheet or from an electrically conductive plastic sheet.

In order to compensate for unevennesses of the screening device 1 particularly in the region of its end wall regions 7, in this exemplary embodiment end wall regions 7 are provided with convex or calotte-like bulges 12, which are arranged at a predetermined distance from one another in the longitudinal direction of the walls 3. These bulges 12 each form an elastic region which is integrally connected to the end wall region 7 and is deformable or designed to be compliant in the direction of the structural unit 2. Each of the bulges 12 can therefore be pressed in to a greater or lesser extent by the electrical printed circuit board when the latter is placed onto the screening device 1, thereby producing reliable contact between the conductor tracks present on the printed circuit board and the end wall regions 7, at least in the region of the bulges 12. The latter are likewise covered with the electrically conductive layer 8 which has already been mentioned.

In order to attain better elasticity of the bulges 12, the latter can be designed to be thinner in the region of their tip than in their edge region.

Figure 3:
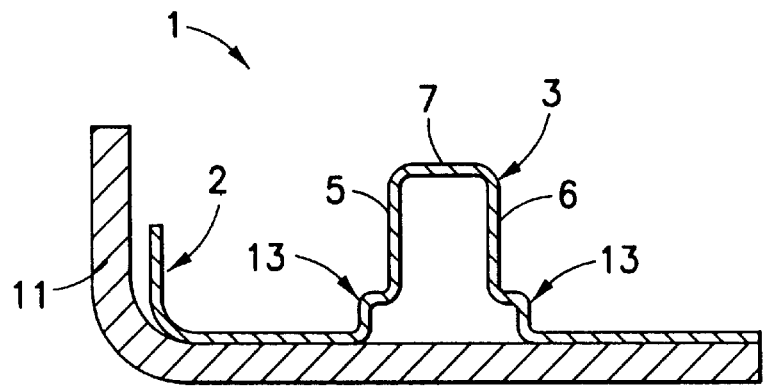
FIG. 3 shows a second embodiment of the screening device.
Figure 4:
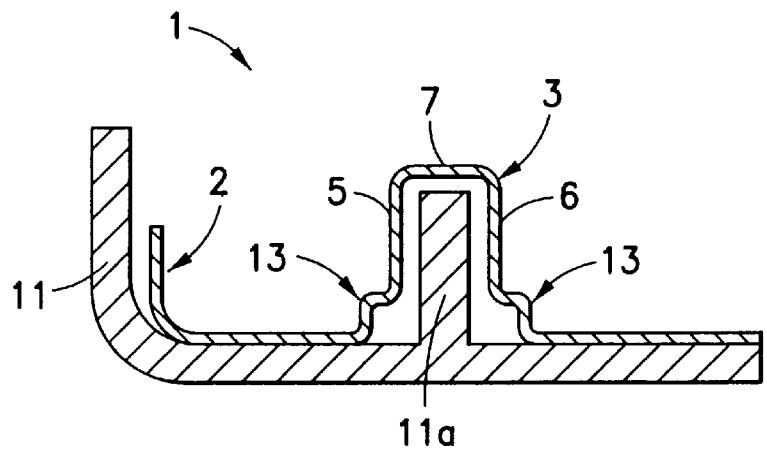
FIG. 4 shows the screening device according to FIG. 3 in a different housing.

FIGS. 3 and 4 show a further configuration of the screening device 1 according to the invention. The screening device 1 is situated with the underside of the structural unit 2 directly on the mount 11 and can be bonded-to the latter or fastened to the latter in some other way, for example by means of knobs which are integrally connected to the mount 11, project in a clamping manner through corresponding openings in the structural unit 2 and are composed of electrically insulating material.

In the lower or base region of the walls 3, the side regions 5 and 6 are angularly bulged over the entire longitudinal direction of the walls 3, so that elastic sections 13 are obtained. In other words, the wall width is greater in the base region of a wall 3 than in the superior region. Consequently, in order to form a wall 3, the sheet 4 in the respective side regions of the wall first of all run approximately perpendicular to the structural unit 2, then a portion which is parallel again and then perpendicular again until the end wall region 7 is reached. The elastic sections 13 in the respective side regions 5 and 6 of a wall 3 consequently enable the upper region of the wall 3 to be pressed down in the direction of the structural unit 2 or mount 11, and consequently enable compliance of the wall 3 during mounting of the printed circuit board which comes to lie thereon. In the mounted state, the end region 7 of the wall 3 consequently presses against a conductor track lying on the printed circuit board, thereby establishing reliable contact between region 7 and conductor track.

FIG. 4 also reveals that the walls 3 themselves can also be used for accommodating structures of the mount 11, in this case as additional partition 11a.

Figure 5:
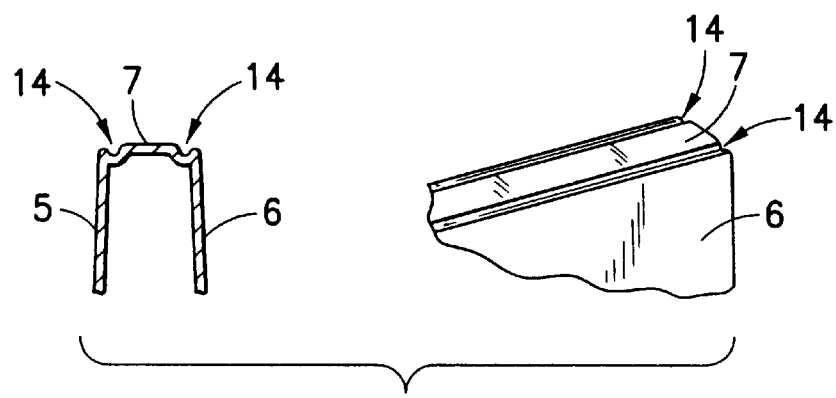
FIG. 5 shows a third embodiment of the screening device.

A further exemplary embodiment of a screening device 1 according to the invention is shown in FIG. 5. In this case, the end wall region 7 of a wall is designed to be elastically compliant over the entire longitudinal direction of the wall. The end wall region 7 is in this case present as a planar surface.

In order to obtain its elasticity, wall sections 14 which are concave in the shape of a step or arc are present on both sides of the end wall region 7 over the entire length of the wall 3, and serve almost as an articulated joint or film hinge between the end wall region 7 and the respective side region 5 or 6. For this purpose, the side regions 5 and 6 are angled virtually acutely at their upper longitudinal edges to run inwards and downwards, and are then guided further inwards running in an arc back upwards so that they laterally adjoin the end wall region 7 which is situated with its outer surface above the upper longitudinal edges of the side regions 5 and 6 in order to-be able to be elastically compliant.

Figure 6:
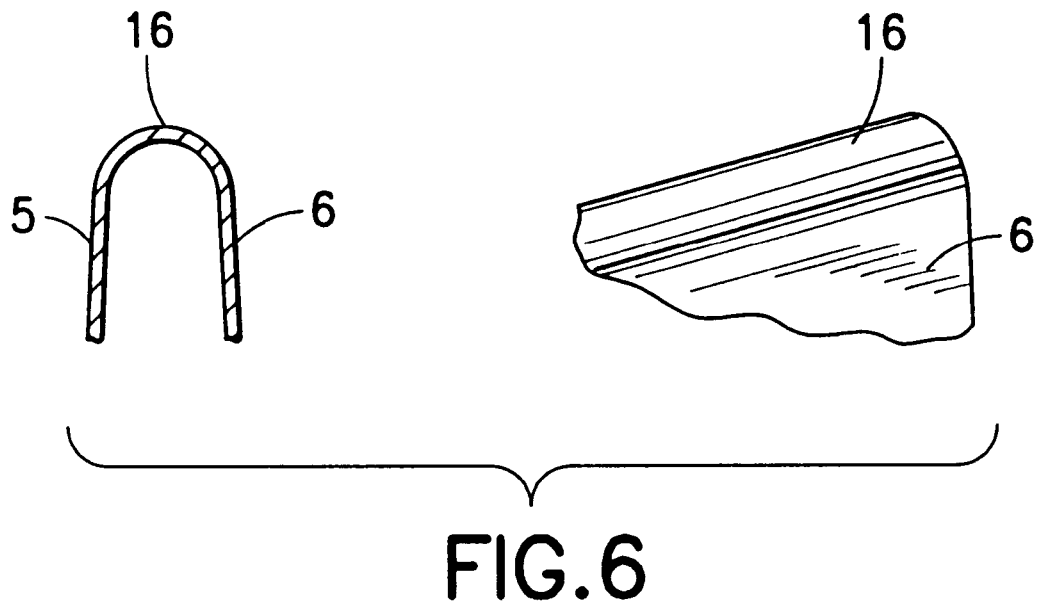
FIG. 6 shows a fourth embodiment of the screening device.

In the exemplary embodiment according to FIG. 6, the side regions 5 and 6 are connected to one another at their upper longitudinal edges over the entire length of the wall 3 by an arcuate section 16, which can like-wise be pressed in to a certain extent and thus designated as an elastic section. It has a convex shape.

Figure 7:
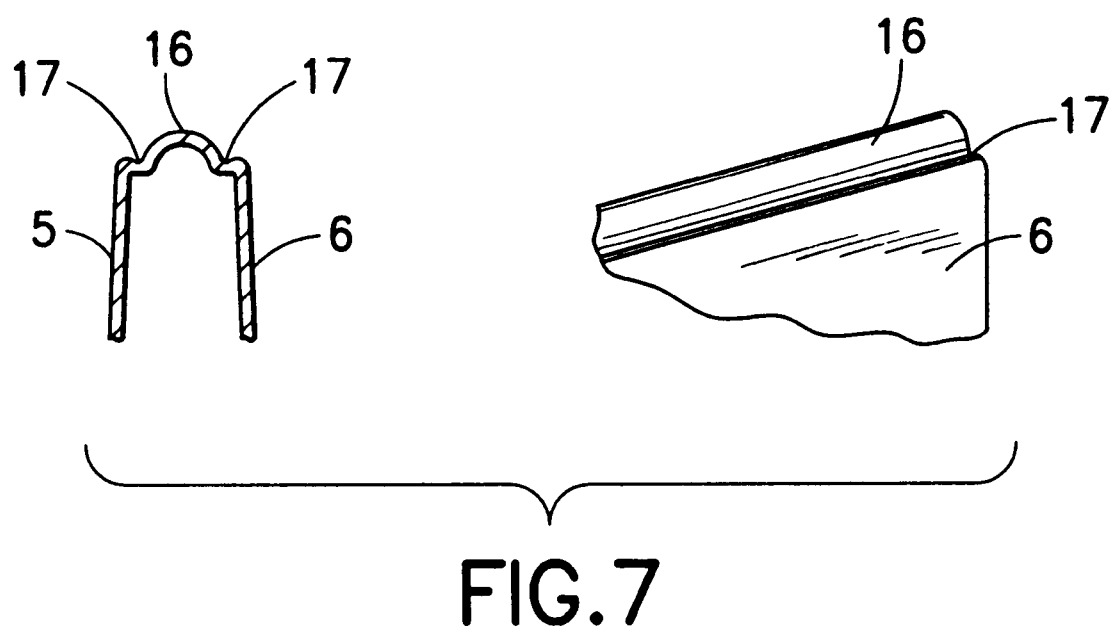
FIG. 7 shows a fifth embodiment of the screening device.

In contrast to the exemplary embodiment according to FIG. 6, in the exemplary embodiment according to FIG. 7 an arcuate section 16 of this type is connected to the upper longitudinal edges of the side regions 5 and 6 by means of film hinges 17 running on both sides of the said section. The film hinges 17 are obtained by virtue of the fact that the upper longitudinal edges of the side regions 5 and 6 are angled acutely to run inwards and downwards and are then bent upwards and passed into the arcuate section 16. In this case, the tip region of the arcuate section 16 is situated above the upper longitudinal edges of the side regions 5 and 6 in order that the arcuate section 16 can still be pressed in.

Figure 8:
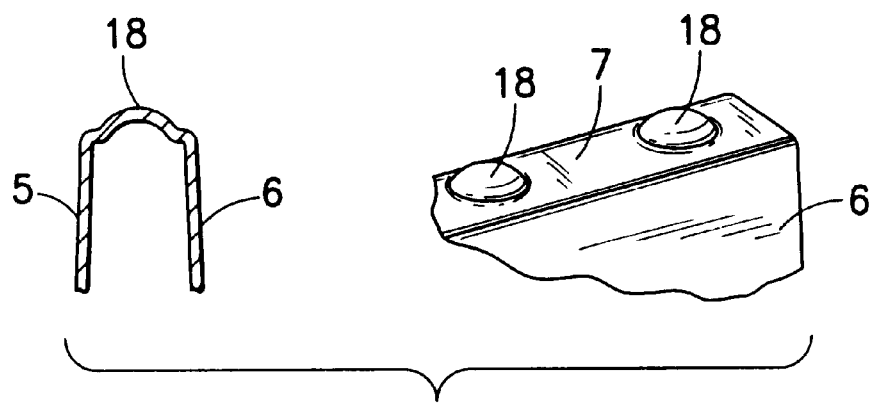
FIG. 8 shows a sixth embodiment of the screening device.
Figure 9:
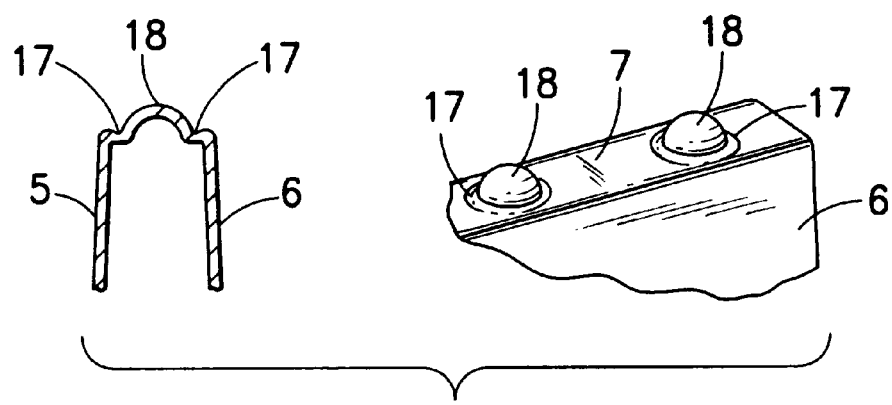
FIG. 9 shows a seventh embodiment of the screening device.

FIGS. 8 and 9 show exemplary embodiments of the screening device 1 according to the invention in which circular dome-like or convex projections are designed as elastic section 18 in the end wall region 7. These dome-like sections 18 are situated at a predetermined distance from one another in the longitudinal direction of the wall 3, which distance results from the frequency of the radiation to be screened.

In the exemplary embodiment according to FIG. 8, the end wall region 7 merges directly with the dome-shaped sections 18 which project above it. At the same time, it is possible in this case, too, for the purpose of increasing the elasticity of the dome-shaped sections 18, for the wall thickness of the latter to decrease in the direction of the uppermost region of the dome-shaped sections 18.

In contrast, in the exemplary embodiment according to FIG. 9, the dome-shaped sections 18 are integrally connected to the end wall region 7 by means of a type of hinge link 17, the hinge link 17 surrounding the dome-shaped section 18 over its entire peripheral edge. The dome-shaped sections 18 are designed like calottes. The hinge link 17 is obtained by virtue of the fact that the end wall region 7 is first of all bent inwards and downwards in the direction of the structural unit 2 and then passes arcuately upwards to merge with the dome-shaped section 18. In this case, the upper tip of the dome-shaped section 18 projects, as already mentioned, above the upper side of the end wall region 7 so that it can still be pressed in. The hinge link 17 can also be formed by individual circular steps which are arranged like a concertina in each case between the end wall region 7 and the dome-shaped sections 18.

Figure 10:
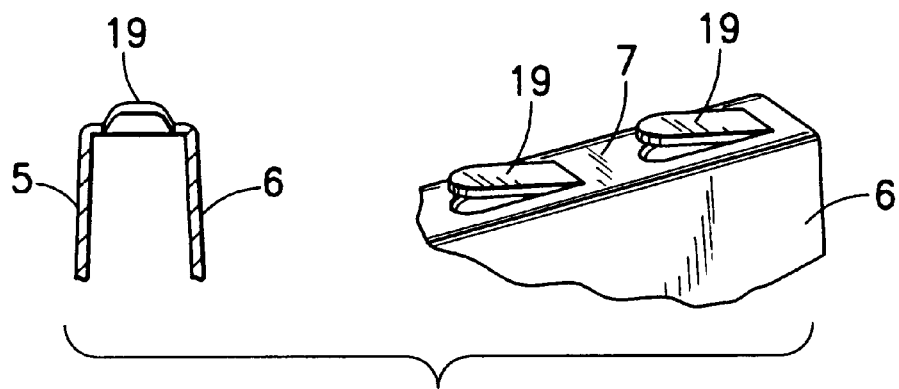
FIG. 10 shows an eighth embodiment of the screening device.

In the exemplary embodiment according to FIG. 10, instead of the dome-shaped sections 18, resilient lugs 19 are now arranged at a predetermined distance from one another in the longitudinal direction of the end wall region 7. The resilient lugs 19 are obtained by virtue of the fact that the end wall region 7 is cut open in regions, with the result that parts of the end wall region 7 can be bent outwards, thereby obtaining the resilient lugs 19.

What is claimed is:

1. Screening device against electromagnetic radiation, having a structural unit (2) which extends in a plane and is provided with walls (3) extending essentially perpendicular to the plane, characterized in that the walls (3) themselves, at least in partial regions, are elastically deformable at their free ends (7) over their entire length in a direction transverse of the plane of the structural unit (2), the structural unit (2) and walls (3) being formed by a deep-drawn sheet, a plurality of dome-shaped sections (18) being integrally connected to the free ends (7), each dome-shaped section being connected by means of an edge region (17) surrounding each dome shaped section (18) designed to be concave in the shape of a step or arc.

2. Screening device against electromagnetic radiation, having a structural unit (2) which extends in a plane and is provided with walls (3) extending essentially perpendicular to the plane, characterized in that the walls (3) themselves, at least in partial regions, are elastically deformable at their free ends over their entire length in a direction transverse of the plane of the structural unit (2), the structural unit (2) and walls (3) being formed by a deep-drawn sheet, edge regions (14, 17) of the ends designed to be concave in the shape of a step or arc.

3. Screening device according to claim 1, characterized in that the deep-drawn sheet (4) is composed of plastic and is provided with an electrically conductive layer (8) at least on the side from which the walls (3) extend.

4. Screening device according to claim 3, characterized in that the electrically conductive layer (8) is a metal vapour deposition layer.

5. Screening device according to claim 1, characterized in that the walls include opposed substantially parallel spaced apart side regions (5, 6) having elastically deformable sections (13).

6. Screening device according to claim 5, characterized in that the elastically deformable sections (13) are situated in the region of the walls adjacent the plane of the structural unit.

7. Screening device according to claim 1, characterized in that the free ends are elastically deformable in sections (18) which are spaced apart from one another.

8. Screening device according to claim 7, characterized in that the free ends are designed to be convex in said sections (18).

* * * * *